(12) United States Patent
Andreev et al.

(10) Patent No.: US 7,207,026 B2
(45) Date of Patent: Apr. 17, 2007

(54) MEMORY TILING ARCHITECTURE

(75) Inventors: Alexandre Andreev, San Jose, CA (US); Igor Vikhliantsev, San Jose, CA (US); Ivan Pavisic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 213 days.

(21) Appl. No.: 10/990,237

(22) Filed: Nov. 16, 2004

(65) Prior Publication Data

US 2006/0104145 A1    May 18, 2006

(51) Int. Cl.
*G06F 17/50* (2006.01)
*H03K 19/00* (2006.01)

(52) U.S. Cl. .................... 716/18; 719/17; 719/10; 719/13

(58) Field of Classification Search .............. 716/4, 716/1, 10, 11, 13, 17, 18
See application file for complete search history.

(56) References Cited

U.S. PATENT DOCUMENTS

| 6,553,552 | B1 * | 4/2003 | Khan et al. ............... 716/10 |
| 6,678,873 | B1 * | 1/2004 | Kohashi et al. ............ 716/11 |
| 6,735,754 | B2 * | 5/2004 | Mehrotra et al. ........... 716/13 |
| 7,013,449 | B2 * | 3/2006 | Schlansker et al. ......... 716/11 |
| 2002/0157066 | A1 * | 10/2002 | Marshall et al. .......... 716/1 |

* cited by examiner

*Primary Examiner*—Stacy A Whitmore
(74) *Attorney, Agent, or Firm*—Luedeka, Neely & Graham, P.C.

(57) ABSTRACT

A method of tiling a customer memory design to configurable memory blocks within a standardized memory matrix. A customer memory capacity and a customer memory width is determined for the customer memory design, and a standardized memory capacity and a standardized memory width is determined for the configurable memory blocks. The customer memory capacity and the customer memory width are selectively transformed by inverse factors based at least in part on a comparison of the customer memory capacity and the standardized memory capacity. Case independent blocks are formed within the configurable memory blocks, where the case independent blocks include gate structures formed in a standardized array in a substrate in which the customer memory design is to be implemented. Case dependent blocks are formed within the configurable memory blocks, where the case dependent blocks are electrically conductive routing layers that selectively connect the case independent blocks according to the transformation of the customer memory design.

4 Claims, 1 Drawing Sheet

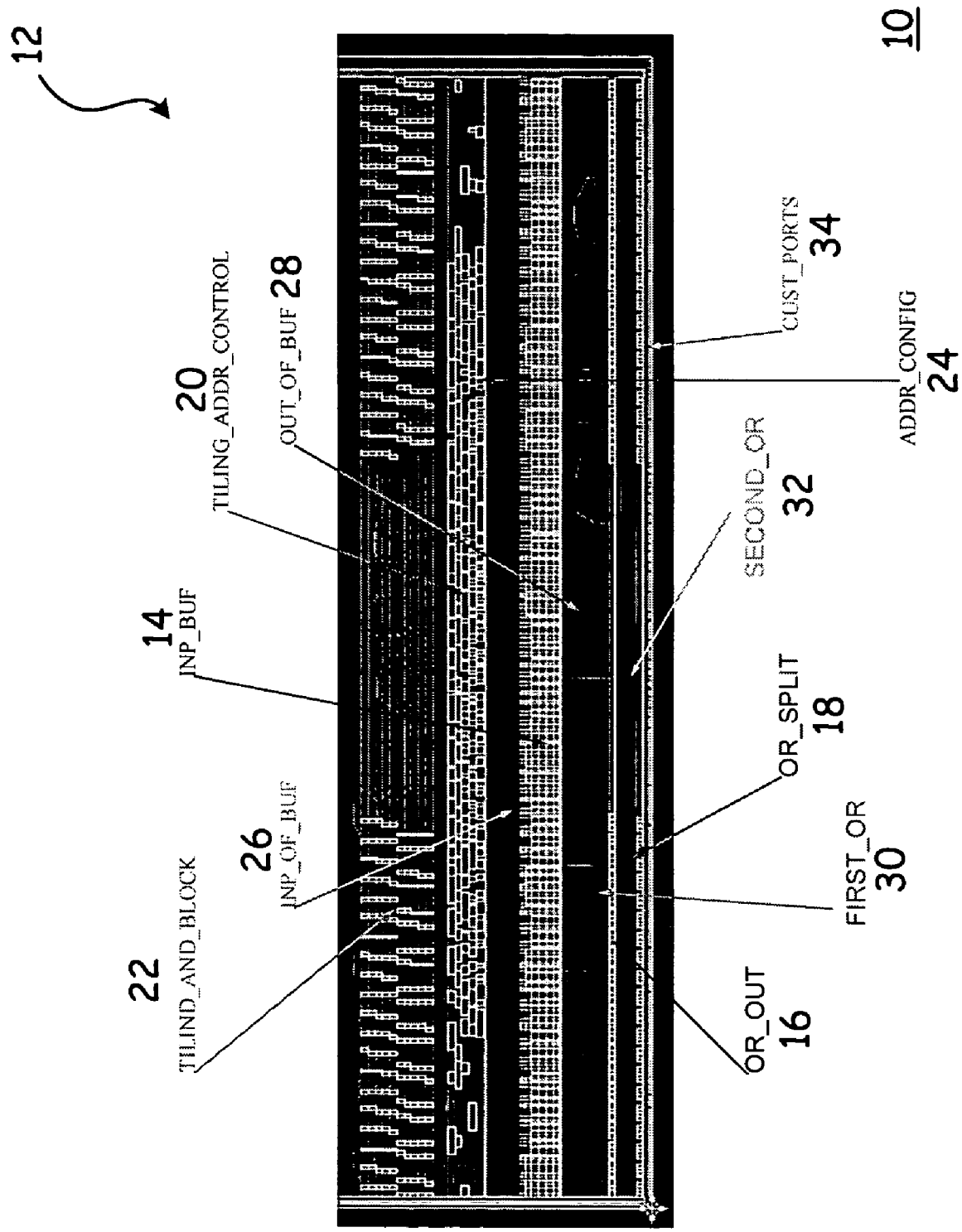

MEMORY TILING ARCHITECTURE

FIELD

This invention relates to the field of integrated-circuits. More particularly, this invention relates to memory architecture.

BACKGROUND

Integrated circuits are often formed using an application specific integrated circuit architecture, which tends to reduce the design costs of the integrated circuit by using predetermined logic blocks in a somewhat customized arrangement to produce an integrated circuit according to a customer's specifications. However, memory architecture for such devices has remained substantially unchanged, with most memories either being completely customized or adapted to use a previously designed memory as is, where a customer's memory design cannot be tiled in more than one memory within the integrated circuit.

What is needed, therefore, is a memory tiling architecture where a customer's memory design can be tiled in more than one memory within the integrated circuit, and most preferably, memory mapping and tiling can be done automatically.

SUMMARY

The above and other needs are met by a method of tiling a customer memory design to configurable memory blocks within a standardized memory matrix. A customer memory capacity and a customer memory width is determined for the customer memory design, and a standardized memory capacity and a standardized memory width is determined for the configurable memory blocks. The customer memory capacity and the customer memory width are selectively transformed by inverse factors based at least in part on a comparison of the customer memory capacity and the standardized memory capacity. Case independent blocks are formed within the configurable memory blocks, where the case independent blocks include gate structures formed in a standardized array in a substrate in which the customer memory design is to be implemented. Case dependent blocks are formed within the configurable memory blocks, where the case dependent blocks are electrically conductive routing layers that selectively connect the case independent blocks according to the transformation of the customer memory design.

According to another aspect of the invention there is described a tiled customer memory design implemented in configurable memory blocks within a standardized memory matrix. Case independent blocks are disposed within the configurable memory blocks, where the case independent blocks include gate structures formed in a standardized array in a substrate in which the customer memory design is implemented. Case dependent blocks are disposed within the configurable memory blocks, where the case dependent blocks are electrically conductive routing layers that selectively connect a desired portion of the case independent blocks according to a transformation of the customer memory design. A customer memory capacity and a customer memory width of the customer memory design are transformed by inverse factors based at least in part on a comparison of the customer memory capacity and a capacity of the standardized memory.

BRIEF DESCRIPTION OF THE DRAWINGS

Further advantages of the invention are apparent by reference to the detailed description when considered in conjunction with the FIGURE, which is not to scale so as to more clearly show the details, wherein like reference numbers indicate like elements, and which depicts a portion of an integrated circuit, showing a memory matrix with memory blocks according to a preferred embodiment of the invention.

DETAILED DESCRIPTION

There are the same basic memories for each matrix. "The same" means here that memories have the same type, the same number of bits, and the same capacity. Basic memories within an integrated circuit are preferably organized in matrices of rows and columns. The customer memory designs can includes memories with various parameters. Mapping of the memories from the customer's designs to matrices with timing optimization is a different topic from that as described herein, and is not described in the present disclosure. The preferred embodiments of the present invention describe how any arbitrary customer memory can be tiled to a collection of basic memories from one matrix in an integrated circuit, after mapping has already been accomplished.

The memory tiling architecture is preferably the same for any mapping and any tiling, given a few timing based limitations. For example, one 2 Mbit memory can be mapped to an entire matrix (50 memories RR2RW2048_20 with 2K capacity and 20 bits), but this tiled memory presently has a speed limitation allow of about 250 Mz. However, the tiling architecture can be transformed to higher speeds of 333 Mz and up, after some modification and area expanding.

Preferably, all of the gates for the tiling are prediffused in the substrate on which the integrated circuit is formed, and various tilings and mappings have different port assignments between given hardmacros. As used herein, a hardmacro or hardmac is a previously placed and routed macro, which tends to provide a performance and density gain. Placement and routing procedures for the memory are beyond the scope of the present invention, and are not described herein.

General Architecture

The number of rows in the memory matrix are denoted by row_numb. For most embodiments row_numb>=3 and <=5. Matrixes with more than five rows are preferably avoided for timing and area purposes. Denote OR2 gate that realizes two inputs disjunction, OR3 is three inputs disjunction, OR4 is four inputs disjunction.

A split on 2 is the term used for a transformation from a memory with a capacity of "cap," and a data width "num_bits" to a memory with a capacity of (cap/2) and a data width of (2*num_bits). A split on 4 is a term used for a transformation from a memory with a capacity of cap and a data width of num_bits to a memory with a capacity of (cap/4) and a data width of (4*num_bits). It is appreciated that a 8096×5 customer memory can be tiled in four 2048× 20 basic memories, but such a tiling tends to be very redundant. However, when a split on 4 is used, this customer memory can be adapted to fit in just one basic memory, as described in more detail below.

The tiling 12 of an integrated circuit 10 for the preferred embodiment contains two types of blocks as depicted in the FIGURE: 1) case-independent blocks that are prediffused, and are designated as INP_BUF 14, OUT_OR 16, OUT_SPLIT 18, TILING_ADDR_CONTROL 20, and TILING_AND_BLOCK 22, and 2) case-dependent blocks such as for constants calculation and connections between the ports of the prediffused blocks, and are designated as ADDR_CONFIG 24, INP_OF_BUF 26, OUT_OF_BUF 28, FIRST_OR 30, SECOND_OR 32, and CUST_PORTS 34.

Consider, for example, the case of a memory matrix that has basic memories with a capacity of cap and a data width of num_bits. In this example, the customer memory is to be tiled from a capacity of cust_cap and a data width of cust_width to some the basic memories within the memory matrix. The first step is preferably to cut cust_width into stripes with a width of "swidth," where swidth=numb_bits if cust_capacity<=4*capacity, swidth=numb_bits/2 if 4*capacity<cust_capacity<=8*capacity, and swidth=numb_bits/4 if 8*capacity<cust_capacity<=16*capacity. Customer memories with a larger capacity need not be considered for timing purposes.

Each stripe is a group for the customer memory, and based on this information for all of the customer memories that are to be tiled in one memory matrix, a configuration tiling file is constructed that is used as an input for creating all of the case dependent blocks, as described above. In this manner the tiling is personalized for any combination of customer memories that can be fitted on the memory matrix. Preferably, none of the hardmacs, or in other words the case-independent blocks, are changed. Instead, new connections between the ports of the hardmacs are created with the case dependent blocks.

Bus Flow During Tiling

Denote by the acronym DIA a data input bus for port A for a 2rw basic memory form memory matrix, where 2rw indicates that the memory has two independent ports, A and B, for reading and writing. The following definitions are also made: DIB is the data input bus for port B, WEA is the write enable bus for port A, WEB is the write enable bus for port B, DOA is the data output bus for port A, DOB is the data output bus for port B, AADR is the address bus for port A, BADR is the address bus for port A, ENA is the enable for port A, ENB is the enable for port B, CLKA is the clock for port A, and CLKB is the clock for port B.

PHY_IN is the internal (physical) input bus for a basic memory of the memory matrix, and is defined to be equal to a function of {CLKB, CLKA, ENB, ENA, BADR, AADR, WEB, WEA, DIB, DIA}. Similarly, PHY_OUT is the internal (physical) output bus for a basic memory of the memory matrix, and is defined to be equal to a function of {DOB, DOA}. CUSTOMER_IN the is external input bus for a matrix with the tiling, and CUSTOMER_OUT is the external output bus for a matrix with the tiling.

Next is described the bus flow between blocks in the tiling. For bus flow from the customer memory to the memory matrix, there is defined: CUSTOMER_IN as the input for INP_OF_BUF, and it is connected to the input ports of the customer memories (CUST_PORTS); PROG_LOG_IN as the output for INP_OF_BUF and input for INP_BUF; PROG_PHY_IN as the output for INP_BUF and input for OUT_OF_BUF; LOG_IN as the output for OUT_OF_BUF and input for TILING_AND_BLOCK; and PHY_IN as the output for TILING_AND_BLOCK and input for matrix.

For bus flow from the memory matrix to the customer memory, there is defined: PHY_OUT as the output for matrix and input for TILING_AND_BLOCK; LOG_OUT as the output for TILING_AND_BLOCK and input for FIRST_OR; ext_or_inp as the input for OUT_OR and output for FIRST_OR; ext_or_out as the output for OUT_OR and input for FIRST_OR; ORS_OUT as the output for FIRST_OR and input for SECOND_OR; ext_split_inp as the input for OUT_SPLIT and output for SECOND_OR; ext_split_out as the output for OUT_SPLIT and input for SECOND_OR; and CUSTOMER_OUT as the output for SECOND_OR, and it is connected to the output ports of the customer memories (CUST_PORTS).

Case-Independent Prediffused Blocks

The INP_BUF block preferably eliminates a big fanout for the inputs by using buffers. For example, if a customer memory is tiled in n basic memories, each input is preferably distributed to n basic memory inputs. This block has an input PROG_LOG_IN and output PROG_PHY_IN. PROG_PHY_IN is preferably a buffered PROG_LOG_IN.

The OUT_OR block preferably contains one OR4 gate, one OR3 gate, and one additional OR4 gate for numb_row=5 for every output. This block has an input bus ext_or_inp and an output bus ext_or_out and realizes the next functions: ext_or_out[0]=ext_or_inp[0] V ext_or_inp[1] V ext_or_inp[2] V ext_or_inp[3], ext_or_out[1]=ext_or_inp[4] V ext_or_inp[5] V ext_or_inp[6], and ext_or_out[2]=ext_or_inp[7] V ext_or_inp[8] V ext_or_inp[9] V ext_or_inp[10] (for numb_row=5), where V is a symbol of disjunction (0 V 0=0, 0 V 1=1, 1 V 0=1, 1 V 1=1). This block can be called a "vertical OR" because it is preferably used to combine the same output signals for basic memories from different rows of given columns, and from left and right columns as necessary.

The OUT_SPLIT block preferably contains three OR2 gates and one additional OR2 gate for numb_row=5. This block has an input bus ext_split_inp and an output bus ext_split_out. This block can be called a "horizontal OR" because it is preferably used to combine split signals into one. If k is the number of OR2 gates in every OUT_SPLIT block, then the total number of OR2 gates in all OUT_SPLIT blocks is equal k*out_width, where the out_width is the width of the buses LOG_OUT and CUSTOMER_OUT, and is preferably not less then that which is necessary for the worst case, which is k*out_width>=(out_width/4)*3*numb_row (three OR2 to combine four inputs, out_width/4 fourths and every customer memory is tiled to one basic memory in a worst case).

So k>=(¾)*numb_row and for numb_row<=4 we choose minimal k=3, and for numb_row=5 we choose minimal k=4.

The block OUT_SPLIT preferably realizes the functions: ext_split_out[0]=ext_split_inp[0] V ext_split_inp[1], ext_split_out[1]=ext_split_inp[2] V ext_split_inp[3], ext_split_out[2]=ext_split_inp[4] V ext_split_inp[5], and ext_split_out[3]=ext_split_inp[6] V ext_split_inp[7] (for numb_row=5).

The TILING_ADDR_CONTROL block has inputs ENABLE, CASE0, CASE1, SPLIT0, SPLIT1, UA, and C, and outputs MEM_ENABLE, WE_AND0, WE_AND1, WE_AND2, WE_AND3, DO_AND0, DO_AND1, DO_AND2, and DO_AND3 for every basic memory matrix. This block preferably calculates the memory enable for each basic memory of the memory matrix, and also calculates the split control signals for WE and DO (WE_AND and DO_AND), by MEM_ENABLE=ENABLE & (UA[n-1]^C[n-1]) & (UA[n-2]^C[n-2]) & . . . & (UA[1]^C[1]) & (UA[0]^C[0]), where & is symbol of conjunction (0 & 0=0, 0 & 1=0, 1 & 0=0, 1 & 1=1), ^is +(mod 2) (0^0=0, 0^1=1, 1^0=1, 1^1=0), and UA={UA[n-1], UA[n-2], . . . , UA[1], UA[0]} is upper bits of customer memory address.

max_capacity=((1<<n)*capacity of basic memory) is the maximal capacity of the customer memory, and C={C[n−1], C[n−2], . . . , C[1], C[0]} is a bitwise representation of the index i for a given memory from the group that corresponds to one customer memory (that is calculated in ADDR_CON-FIG). In other words, MEM_ENABLE=ENABLE & (UA==i).

For example, if a customer memory is tiled in three basic memories, then (00) (01) and (10) are appropriated sets of constants {C[1], C[0]} for these basic memories. NEG_ENABLE=~MEM_ENABLE, where ~A means negation of A (~0=1, ~1=0), W0=~(CASE0 V SPLIT0), W1=~(CASE0 V ~SPLIT0), W2=~(CASE1 V SPLIT1), W3=~(CASE1 V ~SPLIT1), WE_AND0=~(W1 V W3 V NEG_ENABLE), WE_AND1=~(W0 V W3 V NEG_ENABLE), WE_AND2=~(W1 V W2 V NEG_ENABLE), and WE_AND3=~(W0 V W2 V NEG_ENABLE). DO_ANDi is preferably the delayed WE_AND, i.e. the flip flop output where WE_ANDi is input, and i=0, 1, 2, 3.

The TILING_AND_BLOCK block has inputs LOG_IN, PHY_OUT, WE_AND0, WE_AND1, WE_AND2, WE_AND3, DO_AND0, DO_AND$_1$, DO_AND2, and DO_AND3, and outputs PHY_IN and LOG_OUT for each basic memory. This block preferably multiplies every WE and DO bit with the appropriate output of TILING_ADDR_CONTROL (which preferably contains one conjunction for every WE bit and one conjunction for every DO bit). If LOG_IN[i] is WE bit then PHY_IN[i]=LOG_IN[i] & WE_ANDj, where j=i % 4 and i goes through bus LOG_IN, else PHY_IN[i]=LOG_IN[i]. LOG_OUT[i]=PHY_OUT[i] & DO_ANDj where j=i % 4 and i goes through bus PHY_OUT.

Case-Dependent Blocks

All case-dependent blocks preferably contain only assigns, and don't have any gates inside of them. The synthesis of any given case dependent block is dependant on the configuration tiling file, as described above.

The ADDR_CONFIG block preferably calculates the case constants CASE0 and CASE1 and bus C that are used in TILING_ADDR_CONTROL. If split=0 (no split) CASE0=1, CASE1=1. If split=1 (split on 2) CASE0=1, CASE1=0. If split=2 (split on 4) CASE0=0, CASE1=0. If given basic memory has index i in group for customer memory then C is bitwise representation for i, C=(00) for i=0, C=(01) for i=1, C=(10) for i=2, C=(11) for i=3, C=(100) for i=4 and so on.

The INP_OF_BUF block has an input bus CUSTOMER_IN and an output bus PROG_LOG_IN, and preferably makes the assignment from CUSTOMER_IN to PROG_LOG_IN. This block preferably provides the "split" distribution of the data. For example if there is a split on 4, then assign PROG_LOG_IN[j]=CUSTOMER_IN[i]; assign PROG_LOG_IN[j+1]=CUSTOMER_IN[i]; assign PROG_LOG_IN[j+2]=CUSTOMER_IN[i]; assign PROG_LOG_IN[j+3]=CUSTOMER_IN[i]; where j=4*i.

The OUT_OF_BUF block has an input bus PROG_PHY_IN and an output bus LOG_IN, and preferably makes the assignment from PROG_PHY_IN to LOG_IN. For example, let one group (stripe) for a customer memory contain basic memories with indices 1, 2, 3 from a given column. Then OUT_OF_BUF contains the fragment: assign LOG_IN[1]=PROG_PHY_IN[1]; assign LOG_IN[2]=PROG_PHY_IN[1]; assign LOG_IN[3]=PROG_PHY_IN[1].

If the data comes from the previous column, then LEFT_IN is input and LEFT_IN is used instead of PROG_PHY_IN. If the data comes from the next column, then RIGHT_IN is input and RIGHT_IN is used instead of PROG_PHY_IN. If data goes to previous column, then LEFT_IN is output and we assign LEFT_IN=PROG_PHY_IN[i] for appropriated i. If data goes to the next column, then RIGHT_IN is output and we assign RIGHT_IN=PROG_PHY_IN[i] for appropriated i.

This block preferably provides "vertical" distribution of data (indicates in which rows the real data is located and where the bits are distributed). "Vertical" in this application means a distribution between rows of the same column. This block preferably has a different distribution for input data (DI, WE) and for other ports (ADR, CLK, ENABLE).

The FIRST_OR block preferably manages the ports of the prediffused block OUT_OR, and has the inputs LOG_OUT and ext_or_out, and the outputs ext_or_inp and ORS_OUT. This block preferably assigns the appropriate LOG_OUT on the ext_or_inp and decides which ext_or_out from OUT_OR must be the real output ORS_OUT.

The SECOND_OR block preferably manages the ports of the prediffused block OUT_SPLIT, and has the inputs ORS_OUT and ext_split_out, and the outputs ext_split_inp and CUSTOMER_OUT. This block preferably assigns the appropriate ORS_OUT on the ext_split_inp, and decides which ext_split_out from OUT_SPLIT must be the real output CUSTOMER_OUT.

The CUST_PORTS block preferably connects appropriate signals from the buses CUSTOMER_IN and CUSTOMER_OUT to the customer memory input and output ports.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of tiling a customer memory design to configurable memory blocks within a standardized memory matrix, the method comprising the steps of:
  determine a customer memory capacity and a customer memory width for the customer memory design,
  determine a standardized memory capacity and a standardized memory width for the configurable memory blocks,
  selectively transform the customer memory capacity and the customer memory width by inverse factors based at least in part on a comparison of the customer memory capacity and the standardized memory capacity, by transformation from the customer memory design with the customer memory capacity of cap and the customer memory width of num_bits to the configurable memory with standardized memory capacity of (cap/n) and the standardized memory width of (n*num_bits), where n is an interger related at least in part to a comparison between the customer memory capacity and the standardized memory capacity, form case independent blocks within the configurable memory blocks, where the case independent blocks include gate structures formed in a standardized array in a substrate in which the customer memory design is to be implemented, and form case dependent blocks within the configurable memory blocks, where the case dependent blocks are electrically conductive routing layers that selectively connect the case independent blocks according to the transformation of the customer memory design.

2. A method of tiling a customer memory design to configurable memory blocks within a standardized memory matrix, the method comprising the steps of:

determine a customer memory capacity and a customer memory width for the customer memory design, determine a standardized memory capacity and a standardized memory width for the configurable memory blocks, selectively transform the customer memory capacity and the customer memory width by inverse factors based at least in part on a comparison of the customer memory capacity and the standardized memory capacity, by logically cutting cust_width into stripes with a width of swidth, where, swidth=numb_bits when cust_capacity<4*capacity,
swidth=numb_bits/2 when 4*capacity<cust_capacity<8*capacity,
swidth=numb_bits/4 when 8*capacity<cust_capacity<16*capacity,
numb_bits=the standardized memory width,
cust_width=the customer memory width,
cust_capacity=the customer memory capacity, and
capacity=the standardized memory capacity, form case independent blocks within the configurable memory blocks, where the case independent blocks include gate structures formed in a standardized array in a substrate in which the customer memory design is to be implemented, and form case dependent blocks within the configurable memory blocks, where the case dependent blocks are electrically conductive routing layers that selectively connect the case independent blocks according to the transformation of the customer memory design.

3. A tiled customer memory design implemented in configurable memory blocks within a standardized memory matrix, comprising:

case independent blocks within the configurable memory blocks, where the case independent blocks include gate structures formed in a standardized array in a substrate in which the customer memory design is implemented, and case dependent blocks within the configurable memory blocks, where the case dependent blocks are electrically conductive routing layers that selectively connect a desired portion of the case independent blocks according to a transformation of the customer memory design, by transformation from the customer memory design with the customer memory capacity of cap and the customer memory width of num_bits to the standardized memory with a standardized memory capacity of (cap/n) and a standardized memory width of (n*num_bits), where n is an integer related at least in part to a comparison between the customer memory capacity and the standardized memory capacity, where a customer memory capacity and a customer memory width of the customer memory design are transformed by inverse factors based at least in part on a comparison of the customer memory capacity and a capacity of the standardized memory.

4. A tiled customer memory design implemented in configurable memory blocks within a standardized memory matrix, comprising:

case independent blocks within the configurable memory blocks, where the case independent blocks include gate structures formed in a standardized array in a substrate in which the customer memory design is implemented, and case dependent blocks within the configurable memory blocks, where the case dependent blocks are electrically conductive routing layers that selectively connect a desired portion of the case independent blocks according to a transformation of the customer memory design, where a customer memory capacity and a customer memory width of the customer memory design are transformed by inverse factors based at least in part on a comparison of the customer memory capacity and a capacity of the standardized memory, by logically cutting cust_width into stripes with a width of a swidth, where, swidth=numb_bits when cust_capacity<4*capacity,
swidth=numb_bits/2 when 4*capacity<cust_capacity<8*capacity,
swidth=numb_bits/4 when 8*capacity<cust_capacity<16*capacity,
numb_bits=a standardized memory width,
cust_width=the customer memory width,
cust_capacity=the customer memory capacity, and
capacity=a standardized memory capacity, where a customer memory capacity and a customer memory width of the customer memory design are transformed by inverse factors based at least in part on a comparison of the customer memory capacity and a capacity of the standardized memory.

* * * * *